US012733488B2

(12) United States Patent
Lee

(10) Patent No.: US 12,733,488 B2
(45) Date of Patent: Sep. 8, 2026

(54) SEMICONDUCTOR PACKAGE INCLUDING PACKAGE CAP

(71) Applicant: Samsung Electronics Co., Ltd., Suwon-si (KR)

(72) Inventor: Joungphil Lee, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 896 days.

(21) Appl. No.: 17/874,404

(22) Filed: Jul. 27, 2022

(65) Prior Publication Data

US 2023/0187303 A1 Jun. 15, 2023

(30) Foreign Application Priority Data

Dec. 13, 2021 (KR) ........................ 10-2021-0177709

(51) Int. Cl.
*H10W 40/22* (2026.01)
*H10F 39/00* (2025.01)
(Continued)

(52) U.S. Cl.
CPC .......... *H10W 40/22* (2026.01); *H10F 39/804* (2025.01); *H10W 42/20* (2026.01);
(Continued)

(58) Field of Classification Search
CPC ........... H01L 23/3675; H01L 23/49833; H01L 23/552; H01L 23/3128; H01L 25/0652;
(Continued)

(56) References Cited

U.S. PATENT DOCUMENTS 5,608,267 A 3/1997 Mahulikar et al.
6,856,015 B1 2/2005 Huang et al.
(Continued)

FOREIGN PATENT DOCUMENTS

KR 1020080049748 A 6/2008
KR 20180117239 A 10/2018

OTHER PUBLICATIONS

Harry D Rowland et al., "Impact of polymer film thickness and cavity size on polymer flow during embossing: toward process design rules for nanoimprint lithography," J. Micromech. Microeng. 15 (2005) 2414-2425.
(Continued)

*Primary Examiner* — Eric W Jones
(74) *Attorney, Agent, or Firm* — Muir Patent Law, PLLC

(57) ABSTRACT

Disclosed is a semiconductor package comprising a package substrate having a mount region and a peripheral region that surrounds the mount region, a semiconductor device on the mount region of the package substrate, a package cap on the peripheral region of the package substrate and including a partition portion that surrounds the semiconductor device and an extension portion that covers the semiconductor device, and an adhesive layer between the package substrate and a bottom surface of the package cap. The bottom surface of the package cap has a trench. The trench has a trapezoidal cross-section whose width decreases in a direction receding from the bottom surface of the package cap. The adhesive layer is in contact with a top surface of the package substrate and the bottom surface of the package cap. The adhesive layer fills the trench.

13 Claims, 10 Drawing Sheets

(51) Int. Cl.

| | |
|---|---|
| ***H10W 42/20*** | (2026.01) |
| ***H10W 72/00*** | (2026.01) |
| ***H10W 72/30*** | (2026.01) |
| ***H10W 74/10*** | (2026.01) |
| ***H10W 74/15*** | (2026.01) |
| ***H10W 90/00*** | (2026.01) |

(52) U.S. Cl.

CPC ......... *H10W 90/00* (2026.01); *H10W 90/401* (2026.01); *H10F 39/809* (2025.01); *H10W 72/07354* (2026.01); *H10W 72/07554* (2026.01); *H10W 72/347* (2026.01); *H10W 72/352* (2026.01); *H10W 72/354* (2026.01); *H10W 72/879* (2026.01); *H10W 74/117* (2026.01); *H10W 74/15* (2026.01); *H10W 90/722* (2026.01); *H10W 90/734* (2026.01); *H10W 90/736* (2026.01); *H10W 90/754* (2026.01)

(58) Field of Classification Search

CPC ......... H01L 25/18; H01L 24/16; H01L 24/29; H01L 24/32; H01L 24/33; H01L 24/48; H01L 24/73; H01L 2224/16145; H01L 2224/29109; H01L 2224/2919; H01L 2224/32225; H01L 2224/32245; H01L 2224/33181; H01L 2224/48105; H01L 2224/48227; H01L 2224/73204; H01L 2224/73257; H01L 2924/0665; H10F 39/804; H10F 39/809; H10W 40/22; H10W 90/00; H10W 90/401; H10W 90/754; H10W 90/722; H10W 90/734; H10W 90/736; H10W 42/20; H10W 72/354; H10W 72/07554; H10W 72/879; H10W 72/347; H10W 72/07354; H10W 72/352; H10W 74/15; H10W 74/117

USPC .......................................................... 257/659

See application file for complete search history.

(56) References Cited

U.S. PATENT DOCUMENTS

| | | | | |
|---|---|---|---|---|
| 6,919,630 | B2 | 7/2005 | Hsiao | |
| 7,034,387 | B2 | 4/2006 | Karnezos | |
| 8,476,115 | B2 | 7/2013 | Choi et al. | |
| 9,142,481 | B2 | 9/2015 | Kim et al. | |
| 2003/0029545 | A1 | 2/2003 | Fantino et al. | |
| 2004/0174682 | A1 | 9/2004 | Lin et al. | |
| 2004/0188831 | A1* | 9/2004 | Hsiao | H01L 23/36 257/E23.101 |
| 2005/0056926 | A1* | 3/2005 | Chen | H01L 23/10 257/E23.101 |
| 2009/0053449 | A1* | 2/2009 | Hannington | C09J 7/35 428/173 |
| 2010/0143654 | A1* | 6/2010 | Fleming | C09J 7/10 428/156 |
| 2016/0254482 | A1* | 9/2016 | Wang | H10K 59/8722 257/88 |
| 2020/0402882 | A1 | 12/2020 | Kim et al. | |

OTHER PUBLICATIONS

Won-Seock Kim et al., "Evaluation of mechanical interlock effect on adhesion strength of polymer-metal interfaces using micropatterned surface topography," Inter.J.Adhesion&Adhesives 2010 pp. 408-417.

* cited by examiner

SEMICONDUCTOR PACKAGE INCLUDING PACKAGE CAP

CROSS-REFERENCE TO RELATED APPLICATION

This U.S. nonprovisional application claims priority under 35 U.S.C § 119 to Korean Patent Application No. 10-2021-0177709 filed on Dec. 13, 2021 in the Korean Intellectual Property Office, the disclosure of which is hereby incorporated by reference in its entirety.

BACKGROUND

The present inventive concepts relate to a semiconductor package.

The electronics industry has recently been moving to smaller and thinner printed circuit boards with the rapid development of thinner, lighter, and smaller electronic products having higher packing density. Together with portability of electronic devices, multi-functionality and mass data transmit/receive functions necessitate complicated printed circuit board designs. As a result, there has been increased needs for multi-layered printed circuit boards including power supply circuits, ground circuits, signal circuits, etc. formed thereon.

A variety of semiconductor chips, such as central processing units and power integrated circuits, are mounted on multi-layered printed circuit boards. Such semiconductor chips generate high temperature heat when they are operated in use. The high temperature heat may cause semiconductor chips to suffer from overload that leads to malfunctions thereof.

When a plenty of semiconductor chips are mounted on a printed circuit board, electromagnetic interference (EMI) may be generated between the semiconductor chips. Such electromagnetic interference may also induce malfunctions of semiconductor chips.

SUMMARY

Some embodiments of the present inventive concepts provide a semiconductor package with improved structural stability.

Some embodiments of the present inventive concepts provide a method of fabricating a semiconductor package with less occurrence of failure and a semiconductor package fabricated by the same.

According to some embodiments of the present inventive concepts, a semiconductor package may comprise: a package substrate having a mount region and a peripheral region that surrounds the mount region; a semiconductor device on the mount region of the package substrate; a package cap on the peripheral region of the package substrate, the package cap including a partition portion that surrounds the semiconductor device and an extension portion that covers the semiconductor device; and an adhesive layer between the package substrate and a bottom surface of the package cap. The bottom surface of the package cap may have a trench. The trench may have a trapezoidal cross-section whose width decreases in a direction receding from the bottom surface of the package cap. The adhesive layer may be in contact with a top surface of the package substrate and the bottom surface of the package cap. The adhesive layer may fill the trench.

According to some embodiments of the present inventive concepts, a semiconductor package may comprise: a package substrate; an interposer on the package substrate; a chip stack disposed on the interposer and including a plurality of first semiconductor chips that are vertically stacked; a second semiconductor chip disposed on the interposer and horizontally spaced apart from the chip stack; and a package cap disposed on the package substrate and surrounding the interposer. The package cap may be attached to the package substrate through an adhesive layer which is on a bottom surface of the package cap. The package cap may have a trench on the bottom surface of the package cap. The trench may have a width that decreases in a direction receding from the bottom surface of the package cap.

According to some embodiments of the present inventive concepts, a semiconductor package may comprise: a package substrate; a semiconductor device on the package substrate; and a package cap disposed on the package substrate and surrounding the semiconductor device. The package cap may be attached to the package substrate through an adhesive layer which is on a bottom surface of the package cap. A trench may be on the bottom surface of the package cap. The trench may have a trapezoidal cross-section whose width decreases in a direction receding from the bottom surface of the package cap. A plurality of protrusions may be on a bottom surface of the trench and protrude toward the package substrate from the bottom surface of the trench. Protruding heights of the protrusions may be less than a depth of the trench.

BRIEF DESCRIPTION OF THE DRAWINGS

FIGS. 14 and 15 illustrate cross-sectional views showing a semiconductor package according to some embodiments of the present inventive concepts.

DETAIL DESCRIPTION OF EMBODIMENTS

The following will now describe a semiconductor package according to the present inventive concepts with reference to the accompanying drawings.

Figure 1:
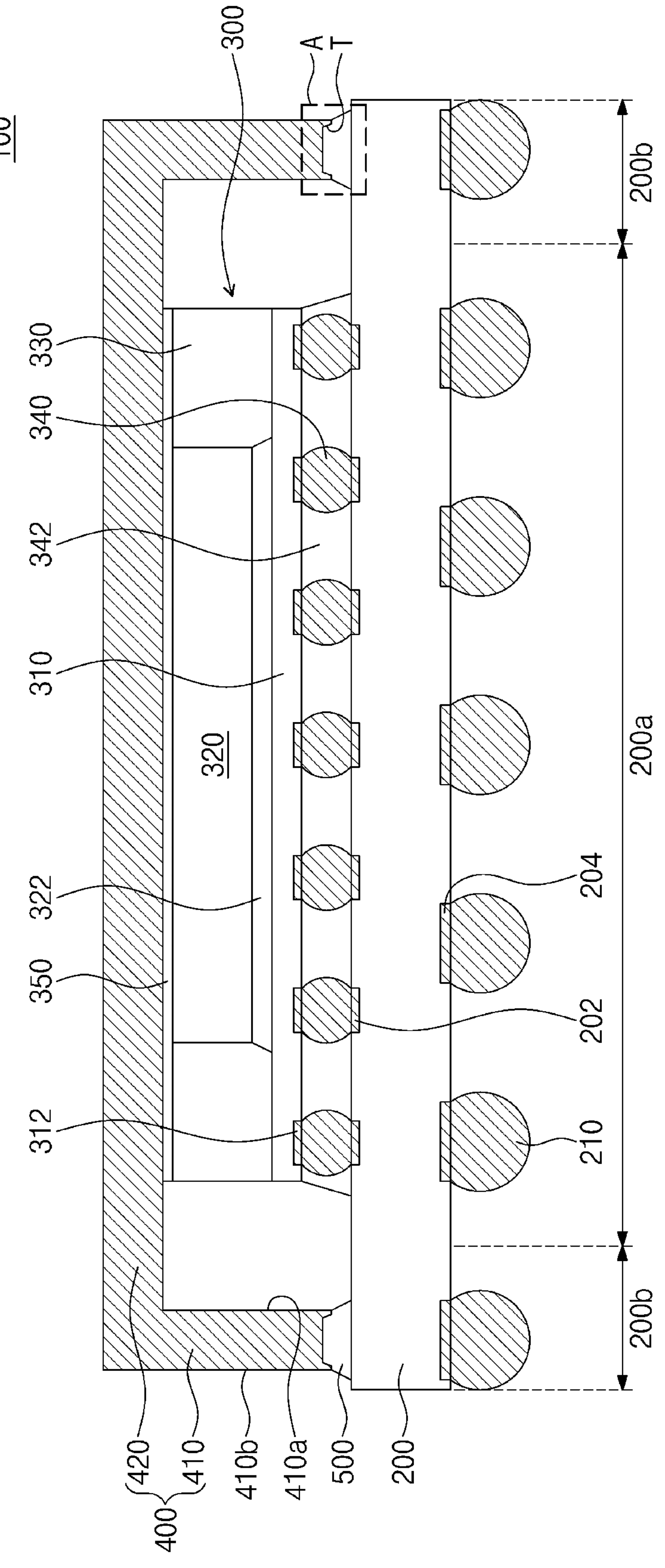
FIG. 1 illustrates a cross-sectional view showing a semiconductor package according to some embodiments of the present inventive concepts.
Figure 2:
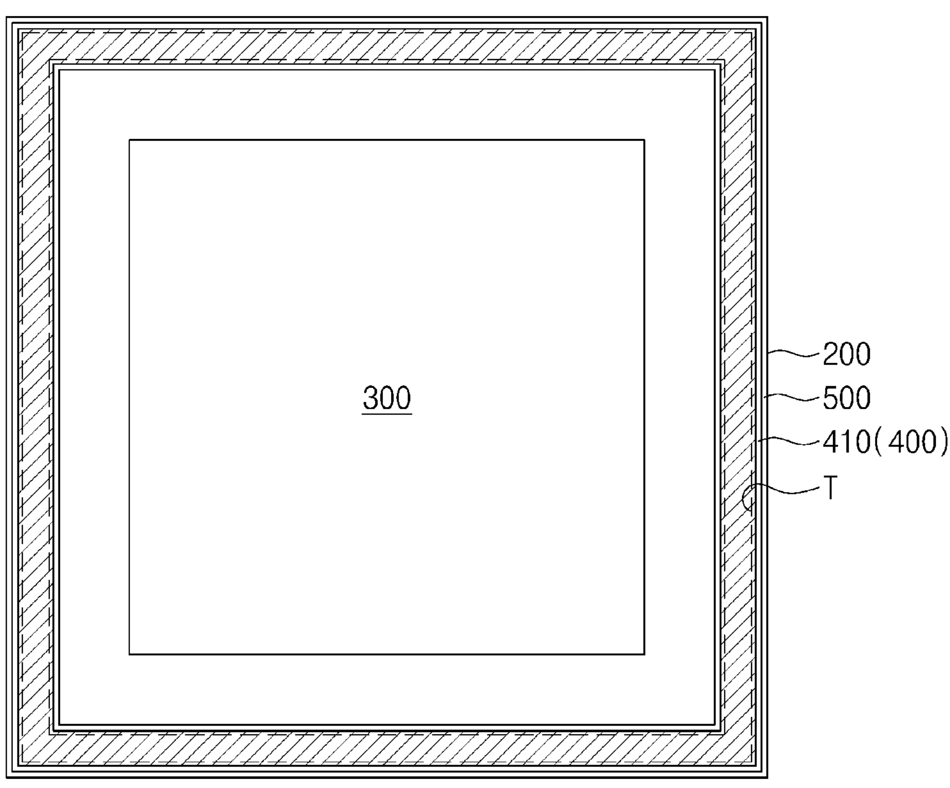
FIG. 2 illustrates a plan view showing a semiconductor package according to some embodiments of the present inventive concepts.
Figure 3:
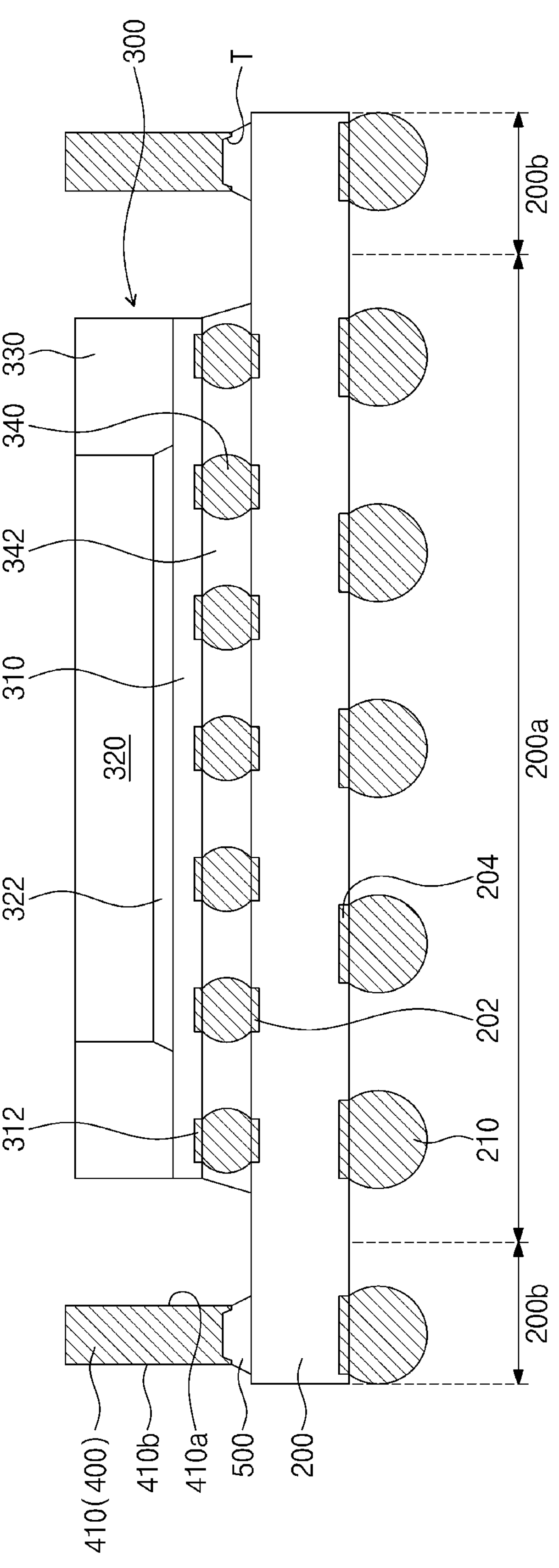
FIG. 3 illustrates a cross-sectional view showing a semiconductor package according to some embodiments of the present inventive concepts.
Figure 4:
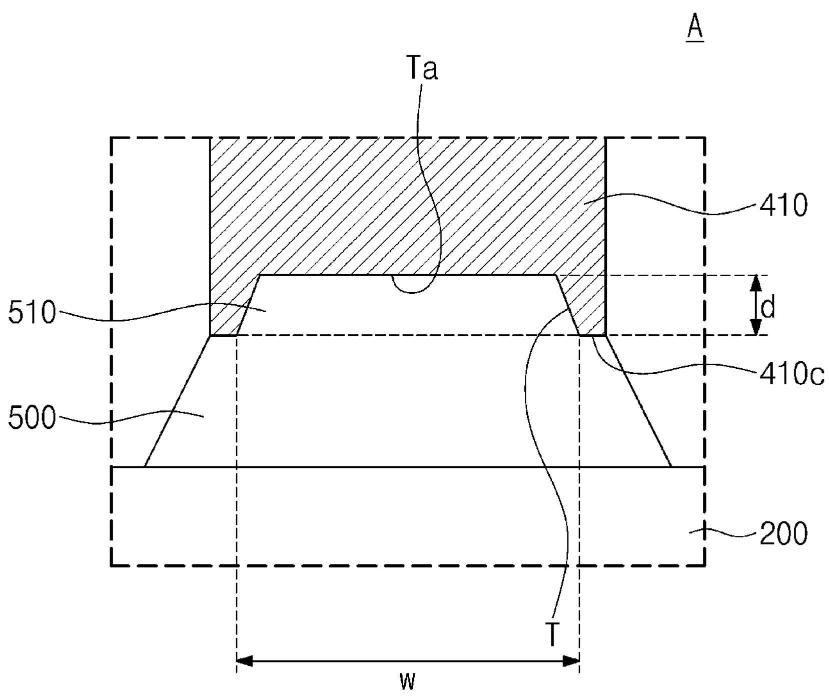
FIGS. 4 to 13 illustrate enlarged views showing section A of FIG. 1.
Figure 5:
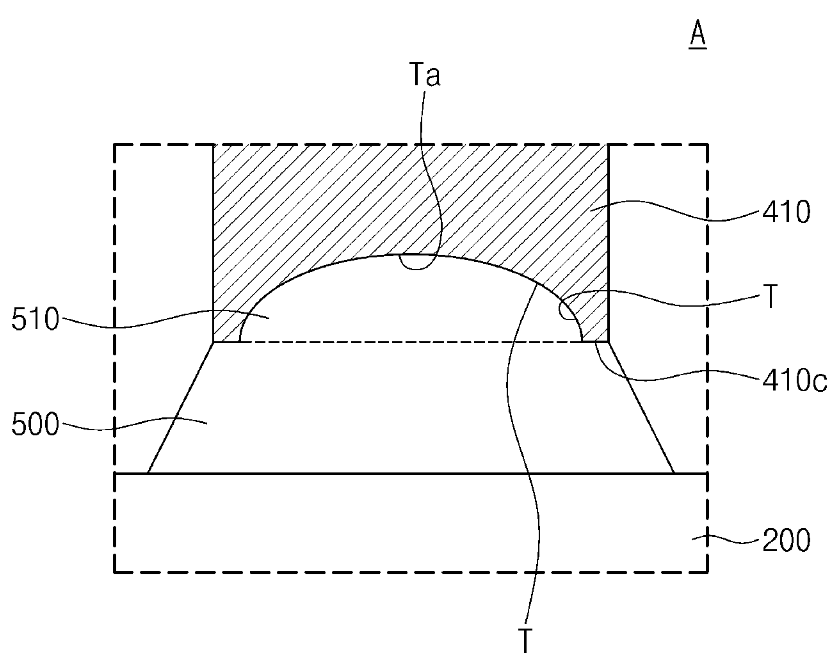
Figure 6:
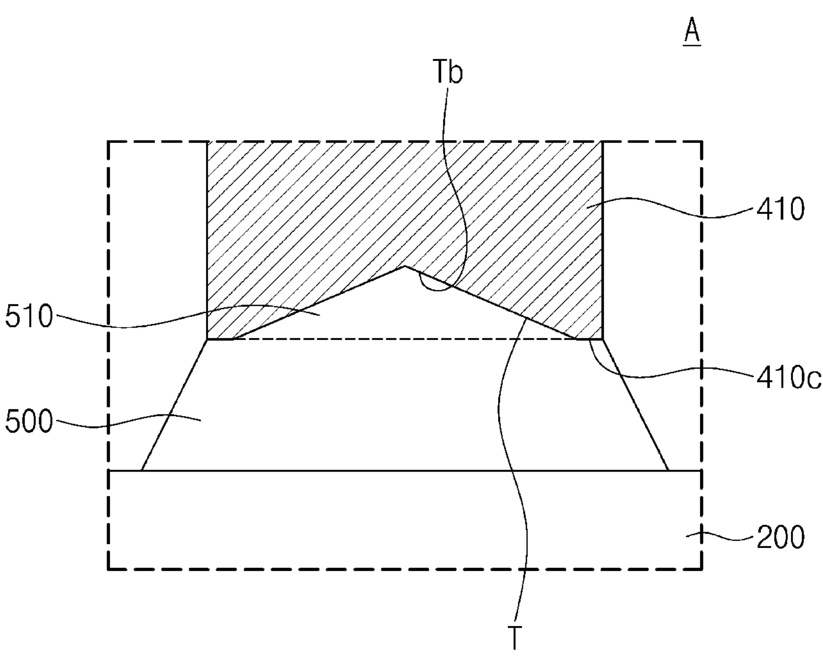

FIG. 1 illustrates a cross-sectional view showing a semiconductor package according to some embodiments of the present inventive concepts. FIG. 2 illustrates a plan view showing a semiconductor package according to some example embodiments of the present inventive concepts. FIG. 3 illustrates a cross-sectional view showing a semiconductor package according to some embodiments of the present inventive concepts. FIGS. 4 to 6 illustrate enlarged views showing section A of FIG. 1.

Referring to FIG. 1, a semiconductor package 100 according to the present embodiment may include at least one semiconductor device 300 mounted on a package substrate 200. The semiconductor device 300 may be covered with a package cap 400 disposed on the package substrate 200.

The package substrate 200 may be a printed circuit board (PCB) with signal patterns formed on a top surface thereof. Alternatively, the package substrate 200 may have a structure in which one or more dielectric layers are stacked alternately with one or more wiring layers. The package substrate 200 may have first substrate pads 202 provided on a top surface of the package substrate 200 and second substrate pads 204 disposed on a bottom surface of the package substrate 200.

The package substrate 200 may have a chip mount region 200*a* and a peripheral region 200*b*. The peripheral region 200*b* may surround the chip mount region 200*a*, e.g., in a plan view. For example, the chip mount region 200*a* may be positioned on an inner side of the peripheral region 200*b*. The chip mount region 200*a* may be an area where the semiconductor device 300 is mounted, and the peripheral region 200*b* may be an area where the package cap 400 is in contact with the package substrate 200.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

A plurality of external terminals 210 may be disposed below the package substrate 200. For example, the external terminals 210 may be disposed on second substrate pads 204 disposed on the bottom surface of the package substrate 200. The external terminals 210 may include or may be solder balls or solder bumps, and depending on types of the external terminals 210, the semiconductor package 100 may be one of a ball grid array (BGA) type, a fine ball-grid array (FBGA) type, and a land grid array (LGA) type. The external terminals 210 may be electrically connected through the second substrate pads 204 to the package substrate 200. In this description, the phrase "electrically connected to" may include the meaning of "directly or indirectly electrically connected to."

As used herein, components described as being "electrically connected" are configured such that an electrical signal can be transferred from one component to the other (although such electrical signal may be attenuated in strength as it transferred and may be selectively transferred). Moreover, components that are "directly electrically connected" share a common electrical node through electrical connections by one or more conductors, such as, for example, wires, pads, internal electrical lines, through vias, etc. As such, directly electrically connected components do not include components electrically connected through active elements, such as transistors or diodes.

The semiconductor device 300 may be disposed on the package substrate 200. The semiconductor device 300 may be placed on the chip mount region 200*a* of the package substrate 200. The semiconductor device 300 may be a package in which a semiconductor chip 320 is packaged such that the semiconductor device 300 (the package) is mounted on the package substrate 200. For example, the semiconductor device 300 may include the semiconductor chip 320 mounted on an interposer substrate 310.

The interposer substrate 310 may have a structure in which one or more dielectric patterns are stacked alternately with one or more redistribution patterns. The interposer substrate 310 may have third substrate pads (not shown) provided on a top surface thereof and fourth substrate pads 312 provided on a bottom surface thereof.

The semiconductor chip 320 may be formed/disposed on the interposer substrate 310 and may have a width less than that of the interposer substrate 310. The semiconductor chip 320 may have inner solder balls (not shown) provided on a bottom surface thereof, and may be electrically connected through the inner solder balls to the third substrate pads of the interposer substrate 310 on the top surface of the interposer substrate 310. An under-fill resin layer (corresponding to 322) may fill a space between the inner solder balls and between the interposer substrate 310 and the semiconductor chip 320. For example, the semiconductor chip 320 may be flip-chip mounted on the interposer substrate 310. Embodiments of the present inventive concepts, however, are not limited thereto, and for example, the semiconductor chip 320 may be electrically connected to the interposer substrate 310 through one or more bonding wires (not shown). The semiconductor chip 320 may be attached to the interposer substrate 310 through an adhesive layer (corresponding to 322) provided on the bottom surface of the semiconductor chip 320. The semiconductor chip 320 may be, for example, a logic chip or a memory chip. The logic chip may include a logic part and a memory part. For example, the memory chip may be a dynamic random-access memory (DRAM) chip, a NAND Flash memory chip, a NOR Flash memory chip, a phase change random-access memory (PRAM) chip, a resistive random-access memory (ReRAM) chip, or a magnetic random-access memory (MRAM) chip.

According to some embodiments, the interposer substrate 310 may be replaced with a redistribution layer. The redistribution layer may be a wiring layer for fan-out redistribution of the semiconductor chip 320 and may be in contact with the bottom surface of the semiconductor chip 320. Therefore, the redistribution layer may be directly connected to the semiconductor chip 320 without the inner solder balls therebetween.

A molding layer 330 may be disposed on the interposer substrate 310. On the interposer substrate 310, the molding layer 330 may surround the semiconductor chip 320. For example, the molding layer 330 may be provided to expose a top surface of the semiconductor chip 320, or differently from that shown, to cover the top surface of the semiconductor chip 320. The molding layer 330 may include or be formed of a dielectric polymer material, such as an epoxy molding compound (EMC).

FIG. 1 shows that one semiconductor chip 320 is included in the semiconductor package 100, but the semiconductor package 100 may include two or more of the semiconductor chips 320 in certain embodiments. For example, the semiconductor device 300 may include a plurality of semiconductor chips that are sequentially stacked. For example, the interposer substrate 310 may be replaced with a base semiconductor chip. The semiconductor device 300 may include the base semiconductor chip and the semiconductor chip 320. The semiconductor chip 320 may be formed/disposed on the base semiconductor chip, and may have a width less than that of the base semiconductor chip. The semiconductor chip 320 and the base semiconductor chip may be electrically connected to each other through inner solder balls (not shown), the under-fill resin layer 322 may fill a space between the inner solder balls. The base semiconductor chip may be a logic chip, and the semiconductor chip 320 may be a memory chip.

The semiconductor device 300 may be flip-chip mounted on the package substrate 200. The fourth substrate pads 312 of the interposer substrate 310 may be formed on the bottom surface of the interposer substrate 310, and may be electrically connected to the first substrate pads 202 of the package substrate 200. Solder balls 340 may be formed/disposed between the fourth substrate pads 312 and the first substrate pads 202. The solder balls 340 may electrically connect the semiconductor device 300 to the package substrate 200. A space between the solder balls 340 may be filled with an under-fill resin layer 342.

According to some embodiments, the semiconductor device 300 may be a single semiconductor chip. For example, the single semiconductor chip may be directly mounted on the package substrate 200 through the solder balls 340 provided on a bottom surface of the single semiconductor chip. However, the semiconductor device 300 is not limited to the examples discussed above, and if necessary, may be provided in the shape of device, package, or any other suitable forms. The following description will focus on the embodiment of FIG. 1.

Referring to FIGS. 1 and 2, a package cap 400 may be provided on the package substrate 200. On the package substrate 200, the package cap 400 may cover the semiconductor device 300. For example, the package cap 400 may have a partition portion 410 disposed on a side of the semiconductor device 300 and an extension portion 420 disposed on/above the semiconductor device 300.

Spatially relative terms, such as "beneath," "below," "lower," "above," "upper" and the like, may be used herein for ease of description to describe positional relationships. It will be understood that the spatially relative terms encompass different orientations of the device in addition to the orientation depicted in the figures.

The partition portion 410 of the package cap 400 may be disposed on the package substrate 200 on a side of the semiconductor device 300. The partition portion 410 may be disposed on the peripheral region 200*b* of the package substrate 200. For example, the partition portion 410 may have a partition wall shape that extends along the peripheral region 200*b*. The partition portion 410 may surround the semiconductor device 300, e.g., in a plan view. For example, the partition portion 410 may have a ring shape that surrounds the semiconductor device 300, e.g., in the plan view. The partition portion 410 may have an inner lateral surface 410*a* directed toward (e.g., facing) the semiconductor device 300 and an outer lateral surface 410*b* opposite the inner lateral surface 410*a*.

The extension portion 420 of the package cap 400 may be disposed above the semiconductor device 300. For example, the extension portion 420 may be disposed on the partition portion 410. For example, a top end of the partition portion 410 may be located at a level the same as or higher than that of a top surface of the semiconductor device 300, and the extension portion 420 may be connected to the top end of the partition portion 410 to be spaced apart from the package substrate 200. The extension portion 420 may extend onto the semiconductor device 300 from the top end of the partition portion 410. The extension portion 420 may cover an entirety of the semiconductor device 300. For example, the extension portion 420 may vertically overlap the entirety of the semiconductor device 300.

The package cap 400, which has the partition portion 410 and the extension portion 420, may have a cap shape that covers the semiconductor device 300. The package cap 400 may include or be formed of a metallic material whose thermal conductivity is high. The package cap 400 may be a component that protects the semiconductor device 300 of the semiconductor package 100 against external impact, outwardly discharges heat generated from the semiconductor device 300, and/or shields electromagnetic interference (EMI) occurring outside the semiconductor package 100 and/or from the semiconductor device 300.

A thermal interface material (TIM) layer 350 may be interposed between the package cap 400 and the semiconductor device 300. For example, the thermal interface material layer 350 may be provided between the package cap 400 and the semiconductor chip 320 and between the package cap 400 and the molding layer 330. The thermal interface material layer 350 may be a thermal transfer member through which heat is delivered from the semiconductor device 300 to the package cap 400. The thermal interface material layer 350 may include or be formed of thermal grease, epoxy materials, or solid particles of metal such as indium (P). The thermal interface material layer 350 may maintain a solid state at low temperatures, but may be converted from its solid state into a liquid state at high temperatures. The thermal interface material layer 350 may have adhesion and/or conductivity.

According to some embodiments, the package cap 400 may not have the extension portion 420. As illustrated in FIG. 3, the package cap 400 may have only the partition portion 410 that surrounds the semiconductor device 300. Therefore, the semiconductor device 300 may be exposed at the top surface thereof, and the thermal interface material layer 350 may not be provided on the top surface of the semiconductor device 300. The following description will focus on the embodiment of FIG. 1.

The package cap 400 may be attached through an adhesive layer 500 to the package substrate 200. For example, the adhesive layer 500 may be disposed on the peripheral region 200*b* of the package substrate 200. The adhesive layer 500 may be provided on a bottom surface of the partition portion 410 of the package cap 400. The adhesive layer 500 may adhere the bottom surface of the partition portion 410 to the top surface of the package substrate 200. The adhesive layer 500 may include or be formed of a material whose thermal conductivity is high. For example, the adhesive layer 500 may include or be formed of a thermal interface material (TIM) such as thermal grease.

According to some embodiments, instead of the adhesive layer 500, an adhesive glue material or a solder material may be used to attach the package cap 400 to the package substrate 200. For example, the adhesive layer 500 may be replaced with one or more solder balls. In this case, the solder balls may be coupled to substrate pads provided on the peripheral region 200*b* of the package substrate 200, and the package cap 400 may be electrically connected through the substrate pads to a ground wiring pattern of the package substrate 200. As the package cap 400 is electrically connected to the ground wiring pattern of the package substrate 200, electromagnetic interference (EMI) may be effectively blocked. The following description will focus on the embodiment of FIG. 1.

A portion of the adhesive layer 500 may be inserted into the partition portion 410 of the package cap 400. For example, the partition portion 410 of the package cap 400 may have a trench T formed on the bottom surface of the partition portion 410, and the adhesive layer 500 may fill the trench T on the bottom surface of the partition portion 410. With reference to FIGS. 4 to 14, the following will describe in detail a configuration of the partition portion 410 and the adhesive layer 500.

Referring to FIGS. 1 to 4, the trench T may be provided on a bottom surface 410*c* of the partition portion 410. The trench T may be inwardly directed/recessed from the bottom surface 410*c* of the partition portion 410. For example, the trench T may extend upwardly from the bottom surface 410*c* of the partition portion 410. For example, trenches T formed in the bottom surface 410*c* of the partition portion 410 in this disclosure may be recesses formed in the bottom surface 410*c*. The recesses may extend along a center of the bottom surface 410*c* in a direction of a lengthwise direction of the bottom surface 410*c*. The trench T may have a trapezoidal shape at a vertical cross-section thereof, e.g., in a cross-sectional view. For example, the trench T may have a width W that decreases in a direction receding from the bottom surface 410*c* of the partition portion 410, and may have a bottom surface Ta parallel to the bottom surface 410*c* of the partition portion 410. In this case, the trench T may have an inner lateral surface that is inclined with respect to the bottom surface Ta of the trench T and the bottom surface 410*c* of the partition portion 410. The vertical cross-section of the trench T may indicate a cross-section of which cross-sectional plane is perpendicular to the package substrate 200 and is viewed in a direction toward the outer lateral surface 410*b* from the inner lateral surface 410*a* of the partition portion 410. The bottom surface Ta of the trench T may be located at a higher level than that of the bottom surface 410*c* of the partition portion 410. The bottom surface Ta of the trench T may be substantially flat. As illustrated in FIG. 2, the trench T may have a ring shape (e.g., in a plan view) that extends along the partition portion 410. For example, the trench T may extend along between the inner lateral surface 410*a* and the outer lateral surface 410*b* of the partition portion 410, e.g., in a plan view, as shown in FIG. 2. The width W of the trench T may be greater than about 200 μm. The width W of the trench T may denote a maximum width of the trench T, and may correspond to a width of the trench T measured on the bottom surface 410*c* of the partition portion 410. A range of about 200 μm to about 500 μm may be given as an interval between the trench T and one of the inner and outer lateral surfaces 410*a* and 410*b* of the partition portion 410. The trench T may have a depth d of about 200 μm to about 500 μm.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The adhesive layer 500 may have an extension 510 that fills the trench T on the bottom surface 410*c* of the partition portion 410. For example, the adhesive layer 500 may be interposed between the bottom surface 410*c* of the partition portion 410 and the top surface of the package substrate 200, and may extend upwards in a vertical direction into the trench T of the partition portion 410. The extension 510 of the adhesive layer 500 may be in contact with the bottom surface Ta and the inner lateral surfaces of the trench T. As the vertical cross-section of the trench T has a trapezoidal shape, the extension 510 of the adhesive layer 500 filling the trench T may have a trapezoidal shape at a vertical cross-section thereof, e.g., in a cross-sectional view as shown in FIG. 4.

According to some embodiments of the present inventive concepts, as the trench T is formed on the bottom surface 410*c* of the partition portion 410, a large contact area and a high adhesive force may be provided between the adhesive layer 500 and the partition portion 410. Therefore, the package cap 400 may be rigidly/strongly attached to the package substrate 200, and the semiconductor package 100 may be provided with increased structural stability.

When a process is performed to attach the adhesive layer 500 to the bottom surface 410*c* of the partition portion 410 in the fabrication of the semiconductor package 100, as the trench T has a trapezoidal shape, the adhesive layer 500 may be easily inserted/filled into the trench T and an air gap, such as bubble, may not be produced inside the trench T between the adhesive layer 500 and the partition portion 410. Accordingly, the adhesive layer 500 may be prevented from being delaminated due to the air gap from the package cap 400 in a heat treatment process such as a curing process of the adhesive layer 500. As a result, it may be beneficial to provide a semiconductor package fabrication method with less occurrence of failure and to provide the semiconductor package 100 with improved structural stability. It should be appreciated that an "air gap" may comprise a gap having air or other gases (e.g., such as those present during manufacturing) or may comprise a gap forming a vacuum therein.

A portion of the adhesive layer 500 positioned between the bottom surface 410*c* of the partition portion 410 and the top surface of the package substrate 200 may protrude from the inner and outer lateral surfaces 410*a* and 410*b* of the partition portion 410 in a horizontal direction receding from a center of the of the adhesive layer 500. For example, the portion of the adhesive layer 500 may have about 0 μm to about 100 μm (e.g., less than 100 μm) as a protruding length from one of the inner and outer lateral surfaces 410*a* and 410*b* of the partition portion 410. In a process where the adhesive layer 500 is attached to the bottom surface 410*c* of the partition portion 410 when the semiconductor package 100 is fabricated, the adhesive layer 500 may be introduced into the trench T, and remaining portions of the adhesive layer 500 may be prevented from excessively protruding from the inner lateral surface 410*a* and/or outer lateral surface 410*b* of the partition portion 410 in the structure of the present embodiments. Accordingly, the package substrate 200 may be prevented from being contaminated due to the remaining portions of the adhesive layer 500, and the semiconductor package 100 may be prevented from warpage caused by the remaining portions of the adhesive layer 500.

FIG. 4 shows that the partition portion 410 is provided on its bottom surface 410*c* with the trench T having a trapezoidal shape at its vertical cross-section, but the present inventive concepts are not limited thereto.

According to some embodiments, as illustrated in FIG. 5, the trench T may be inwardly directed/recessed from the bottom surface 410*c* of the partition portion 410. For example, the trench T may be upwardly directed/recessed from the bottom surface 410*c* of the partition portion 410. For example, the bottom surface 410*c* may be recessed upwards to form a trench T in the bottom surface 410*c* of the partition portion 410. The trench T may have a semicircular shape at a vertical cross-section thereof as shown in FIG. 5. For example, the trench T may have a width in a horizontal direction that decreases in a vertical direction receding from the bottom surface 410*c* of the partition portion 410. The bottom surface Ta of the trench T may be curved from the inner lateral surface 410*a* toward the outer lateral surface 410*b*, and opposite ends of the bottom surface Ta may be connected to the bottom surface 410*c* of the partition portion 410. The bottom surface Ta of the trench T may be located at a higher level than that of the bottom surface 410*c* of the partition portion 410. For example, the bottom surface Ta of the trench T may be a top surface of the recess formed in the bottom surface 410*c*. The trench T may have a ring shape (e.g., in a plan view) that extends along the partition portion 410. The trench T may have a width greater than about 200 μm. A range of about 200 μm to about 500 μm may be given as an interval between the trench T and each of the inner and outer lateral surfaces 410*a* and 410*b* of the partition portion 410. The trench T may have a depth of about 200 μm to about 500 μm.

According to some embodiments, as illustrated in FIG. 6, the trench T may be inwardly directed from the bottom surface 410*c* of the partition portion 410. For example, the trench T may be upwardly directed from the bottom surface 410*c* of the partition portion 410. The trench T may have a triangular shape at a vertical cross-section thereof. For example, the trench T may have a width in a horizontal direction that decreases in a vertical direction receding from the bottom surface 410*c* of the partition portion 410. The trench T may have sidewalls Tb that are inclined with respect to the bottom surface 410*c* of the partition portion 410 and are correspondingly/respectively adjacent to the inner and outer lateral surfaces 410*a* and 410*b* of the partition portion 410. The sidewalls Tb of the trench T may be connected to each other on a central portion of the trench T. The trench may have a top end where the sidewalls Tb meet each other, and the top end may be located at a higher level than that of the bottom surface 410*c* of the partition portion 410. The trench T may have a ring shape that extends along the partition portion 410, e.g., in a plan view. The trench T may have a width greater than about 200 μm. A range of about 200 μm to about 500 μm may be given as an interval between the trench T and each of the inner and outer lateral surfaces 410*a* and 410*b* of the partition portion 410. The trench T may have a depth of about 200 μm to about 500 μm.

Figure 7:
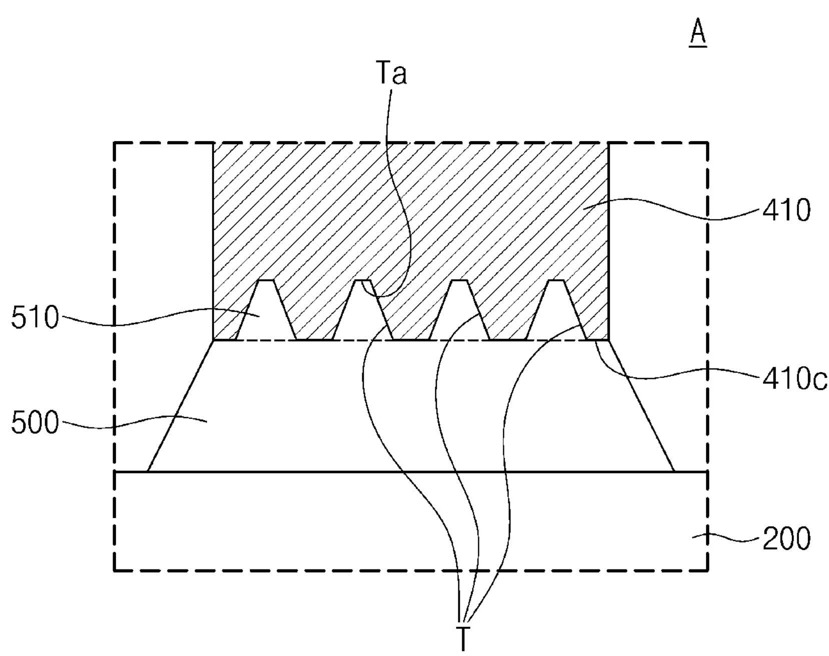
Figure 8:
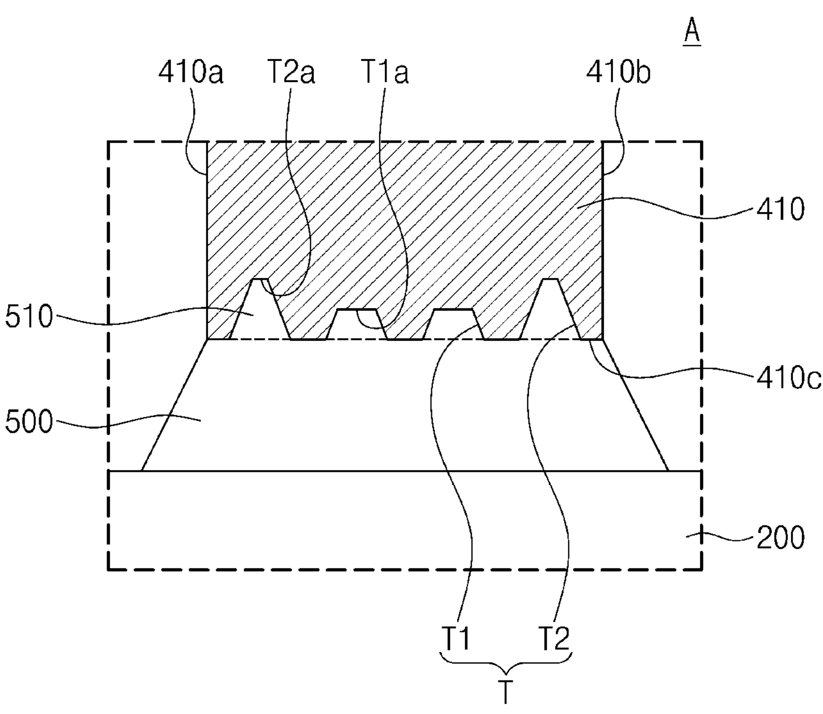

FIGS. 1 to 4 depict that one trench T is provided between the inner lateral surface 410*a* and the outer lateral surface 410*b* of the partition portion 410, but the present inventive concepts are not limited thereto. FIGS. 7 and 8 illustrate enlarged views showing section A of FIG. 1.

Referring to FIG. 7, a plurality of trenches T may be provided on the bottom surface 410*c* of the partition portion 410. The trenches T may be inwardly directed/recessed from the bottom surface 410*c* of the partition portion 410. For example, the trenches T may be upwardly directed/recessed from the bottom surface 410*c* of the partition portion 410. Each of the trenches T may have a trapezoidal shape at a vertical cross-section thereof. For example, each of the trenches T may have a width in a horizontal direction that decreases in a vertical direction receding from the bottom surface 410*c* of the partition portion 410, and may have a bottom surface Ta (e.g., a top surface of the recess) parallel to the bottom surface 410*c* of the partition portion 410. The bottom surfaces Ta of the trenches T may be located at a higher level than that of the bottom surface 410*c* of the partition portion 410. The bottom surfaces Ta of the trenches T may be substantially flat. The trenches T may have their ring shapes that extend along the partition portion 410, e.g., in a plan view. For example, the trenches T may extend along between the inner lateral surface 410*a* and the outer lateral surface 410*b* of the partition portion 410, e.g., in a plan view. The trenches T may be arranged in a direction from the inner lateral surface 410*a* toward the outer lateral surface 410*b* of the partition portion 410. For example, the trenches T may have their ring shapes that surround each other. For example, some of the plurality trenches T may surround one or more of other trenches T. The trenches T may each have a width greater than about 200 μm. An interval between the trenches T may range from about 200 μm to about 500 μm. The interval between the trenches T may indicate a distance between the trenches T on the bottom surface 410*c* of the partition portion 410. A range of about 200 μm to about 500 μm may be given as an interval between the inner lateral surface 410*a* and the trench T adjacent to the inner lateral surface 410*a* (e.g., the innermost trench T) and between the outer lateral surface 410*b* and the trench T adjacent to the outer lateral surface 410*b* (e.g., the outermost trench T). The trenches T may each have a depth of about 200 μm to about 500 μm.

According to some embodiments, as illustrated in FIG. 8, the trenches T may have their depths that increase in a direction approaching the inner and outer lateral surfaces 410*a* and 410*b* of the partition portion 410. For example, the bottom surface 410*c* of the partition portion 410 may include outer regions adjacent to the inner and outer lateral surfaces 410*a* and 410*b* of the partition portion 410 and may also include an inner region between the outer regions. The trenches T may have first trenches T1 provided on the inner region and second trenches T2 provided on the outer regions. For example, the second trenches T2 may be disposed closer than the first trenches T1 to the inner and outer lateral surfaces 410*a* and 410*b* of the partition portion 410. The first trenches T1 may have a first depth less than a second depth of the second trenches T2. For example, the first trenches T1 may have their first bottom surfaces T1*a* located at a lower level than that of second bottom surfaces T2*a* of the second trenches T2. Alternatively, based on the number of the trenches T, the trenches T may have their depths that gradually decrease in accordance with a distance from the inner and outer lateral surfaces 410*a* and 410*b* of the partition portion 410, e.g., in a direction receding from the inner and outer lateral surfaces 410*a* and 410*b* of the partition portion 410.

FIGS. 1 to 4 show that the bottom surface Ta of the trench T is flat, but the present inventive concepts are not limited thereto. FIGS. 9 to 13 illustrate enlarged views showing section A of FIG. 1.

Figure 9:
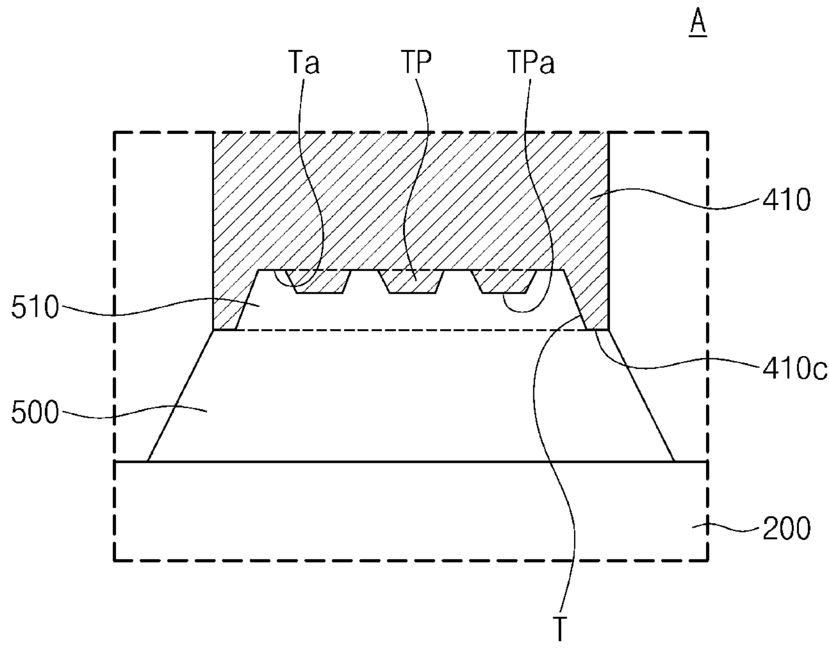

Referring to FIG. 9, at least one protrusion TP may be provided in the trench T. The protrusions TP may protrude from the bottom surface Ta of the trench T. The protrusions TP may have their protruding heights from the bottom surface Ta of the trench T, and the protruding heights may be less than a depth of the trench T. The protrusions TP may have their ring shapes that extend along the partition portion 410, e.g., in a plan view. For example, the protrusions TP may extend along between the inner lateral surface 410*a* and the outer lateral surface 410*b* of the partition portion 410, e.g., in the plan view. Alternatively, the protrusions TP may have island shapes that are disposed adjacent to each other on the bottom surface Ta of the trench T.

The protrusions TP may each have a width in a horizontal direction that decreases in a vertical direction receding from the bottom surface Ta of the trench T. The protrusions TP may each have a trapezoidal shape at a vertical cross-section thereof. For example, the protrusions TP may each have a width in a horizontal direction that decreases in a vertical direction receding from the bottom surface Ta of the trench T, and may have their planarized surfaces TPa parallel to the bottom surface Ta of the trench T, e.g., at the end of the protrusion TP having the least width. In this case, the protrusions TP may have their outer lateral surfaces that are inclined with respect to the bottom surface Ta of the trench T and the planarized surfaces TPa of the protrusions TP. The vertical cross-section of each of the protrusions TP may indicate a cross-section in a direction toward the outer lateral surface 410*b* from the inner lateral surface 410*a* of the partition portion 410. The planarized surfaces TPa of the protrusions TP may be located at a (vertical) level lower than that of the bottom surface Ta of the trench T and higher than that of the bottom surface 410*c* of the partition portion 410. The planarized surfaces TPa of the protrusions TP may be substantially flat.

Terms such as "flat," "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The protrusions TP may have their widths of about 200 μm to about 500 μm. In this description, the width of the protrusion TP may be a maximum width of the protrusion TP and may be measured on the bottom surface Ta of the trench T. The protrusions TP may have their protruding heights of about 200 μm to about 500 μm. An interval between the protrusions TP may range from about 0 μm to about 500 μm.

According to some embodiments of the present inventive concepts, as the protrusions TP are provided in the trench T, a large contact area and a high adhesive force may be provided between the adhesive layer 500 and the partition portion 410. Therefore, the package cap 400 may be rigidly/strongly attached to the package substrate 200, and the semiconductor package 100 may be provided with increased structural stability.

When a process is performed to attach the adhesive layer 500 to the bottom surface 410*c* of the partition portion 410 in fabrication of the semiconductor package 100, as the protrusions TP have a trapezoidal shape, the adhesive layer 500 may be easily introduced between the protrusions TP and an air gap, such as bubble, may not be produced inside the trench T between the adhesive layer 500 and the partition portion 410. Accordingly, the adhesive layer 500 may be prevented from being delaminated due to the air gap from the package cap 400 in a heat treatment process such as a curing process of the adhesive layer 500. As a result, a semiconductor package fabrication method with less occurrence of failure and the semiconductor package 100 with improved structural stability may be provided.

FIG. 9 depicts that the trench T is provided on its bottom surface Ta with the protrusions TP having trapezoidal shapes at their vertical cross-sections, e.g., in a cross-sectional view, but the present inventive concepts are not limited thereto.

Figure 10:
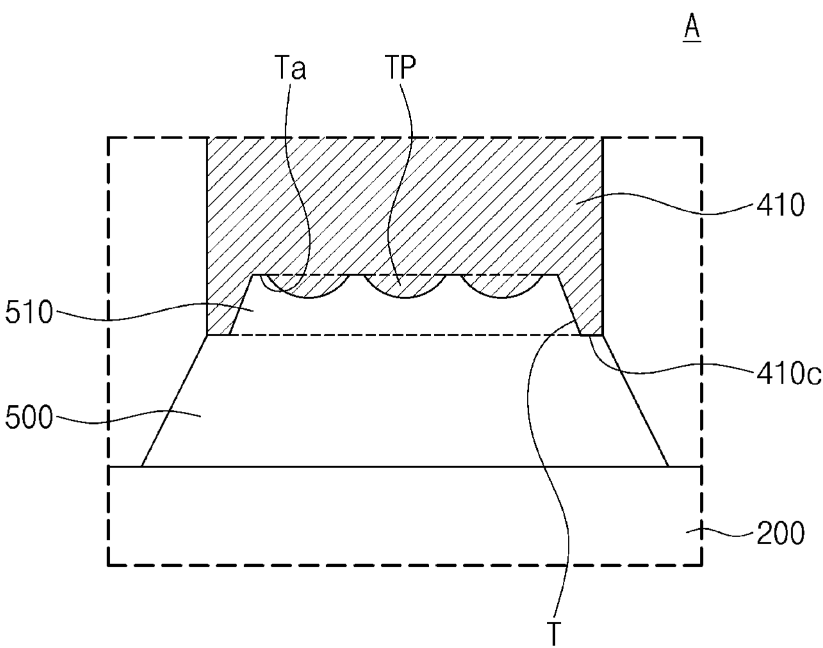
Figure 11:
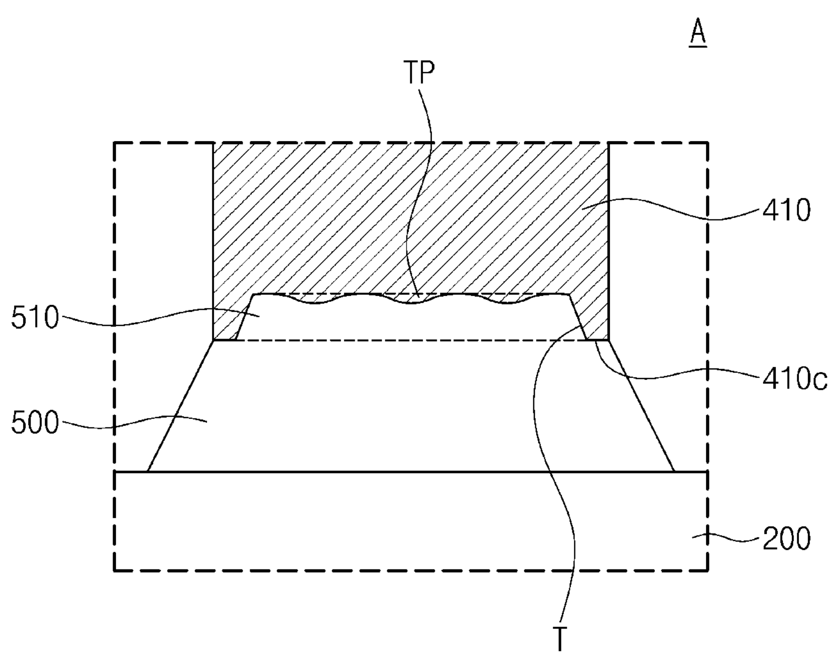

According to some embodiments, as illustrated in FIG. 10, the protrusions TP may be downwardly directed from the bottom surface Ta of the trench T. The protrusions TP may have their semicircular shapes at vertical cross-sections thereof, e.g., in a cross-sectional view. For example, the protrusions TP may each have a width in a horizontal direction that decreases in a vertical direction receding from the bottom surface Ta of the trench T. The protrusions TP may have their bottom surfaces that roundly protrude from the bottom surface Ta of the trench T. For example, the protrusions TP may have round bump shapes. The protrusions TP may have their bottom ends that are located at a level lower than that of the bottom surface Ta of the trench T and higher than that of the bottom surface 410*c* of the partition portion 410. Alternatively, as illustrated in FIG. 11, the protrusions TP may have their bottom surfaces that are rounded and smoothly connected to the bottom surface Ta of the trench T. The bottom surfaces of the protrusions TP and the bottom surface Ta of the trench T may constitute a wavy shaped cross-section. For example, the bottom surfaces of the protrusions TP and the bottom surface Ta of the trench T may constitute a smooth curve in a cross-sectional view as shown in FIG. 11.

Figure 12:
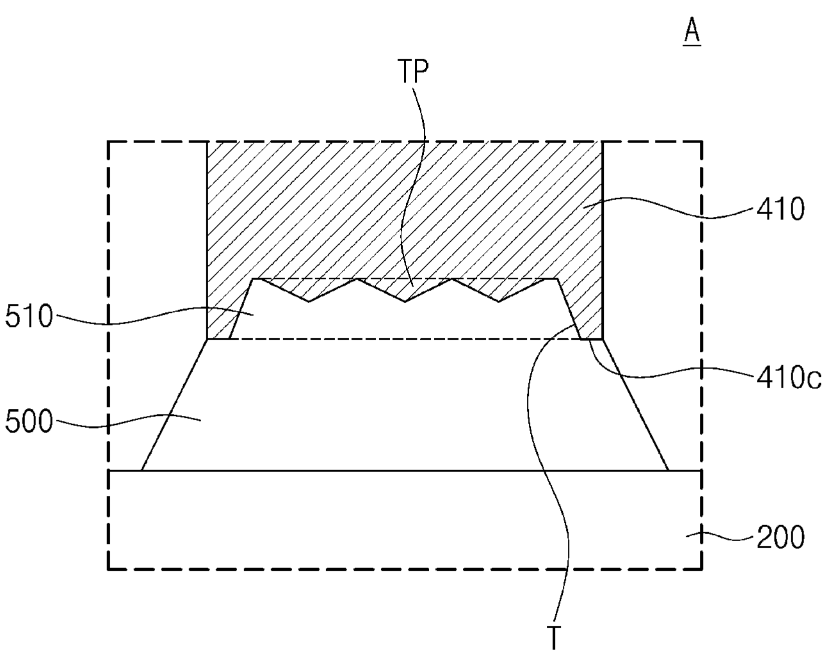

According to some embodiments, as illustrated in FIG. 12, the protrusions TP may protrude downwardly from the bottom surface Ta of the trench T. The protrusions TP may have their triangular shapes at vertical cross-sections thereof. For example, the protrusions TP may each have a width in a horizontal direction that decreases in a vertical direction receding from the bottom surface Ta of the trench T. The protrusions TP may have their lateral surfaces that are inclined with respect to the bottom surface Ta of the trench T. The protrusions TP may have their bottom ends that are located at a level lower than that of the bottom surface Ta of the trench T and higher than that of the bottom surface 410*c* of the partition portion 410.

Figure 13:
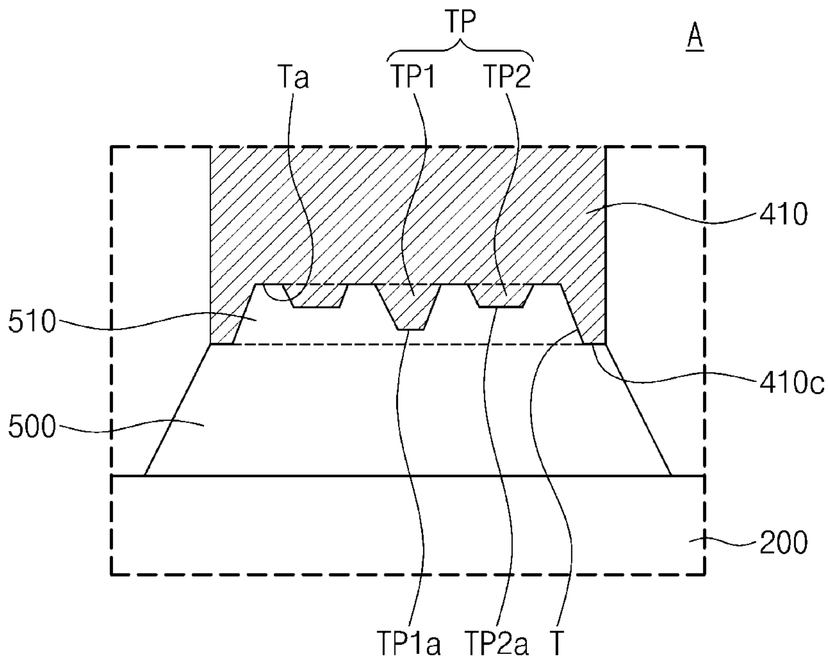

According to some embodiments, as illustrated in FIG. 13, the protrusions TP may have their protruding heights in a vertical direction that decrease in a horizontal direction receding from the inner lateral surface 410*a* and the outer lateral surface 410*b* of the partition portion 410. For example, the bottom surface 410*c* of the partition portion 410 may include outer regions adjacent to the inner and outer lateral surfaces 410*a* and 410*b* of the partition portion 410 and may also include an inner region between the outer regions. The protrusions TP may have first protrusions TP1 provided on the inner region and second protrusions TP2 provided on the outer regions. For example, the second protrusions TP2 may be disposed closer than the first protrusions TP1 to the inner and outer lateral surfaces 410*a* and 410*b* of the partition portion 410. The first protrusions TP1 may have their first protruding heights greater than second protruding heights of the second protrusions TP2. For example, the first protrusions TP1 may have their first planarized surfaces TP1*a* located at a lower level than that of second planarized surfaces TP2*a* of the second protrusions TP2. Alternatively, based on the number of the protrusions TP, the protrusions TP may have their protruding heights that gradually increase in a direction receding from the inner and outer lateral surfaces 410*a* and 410*b* of the partition portion 410.

Figure 14:
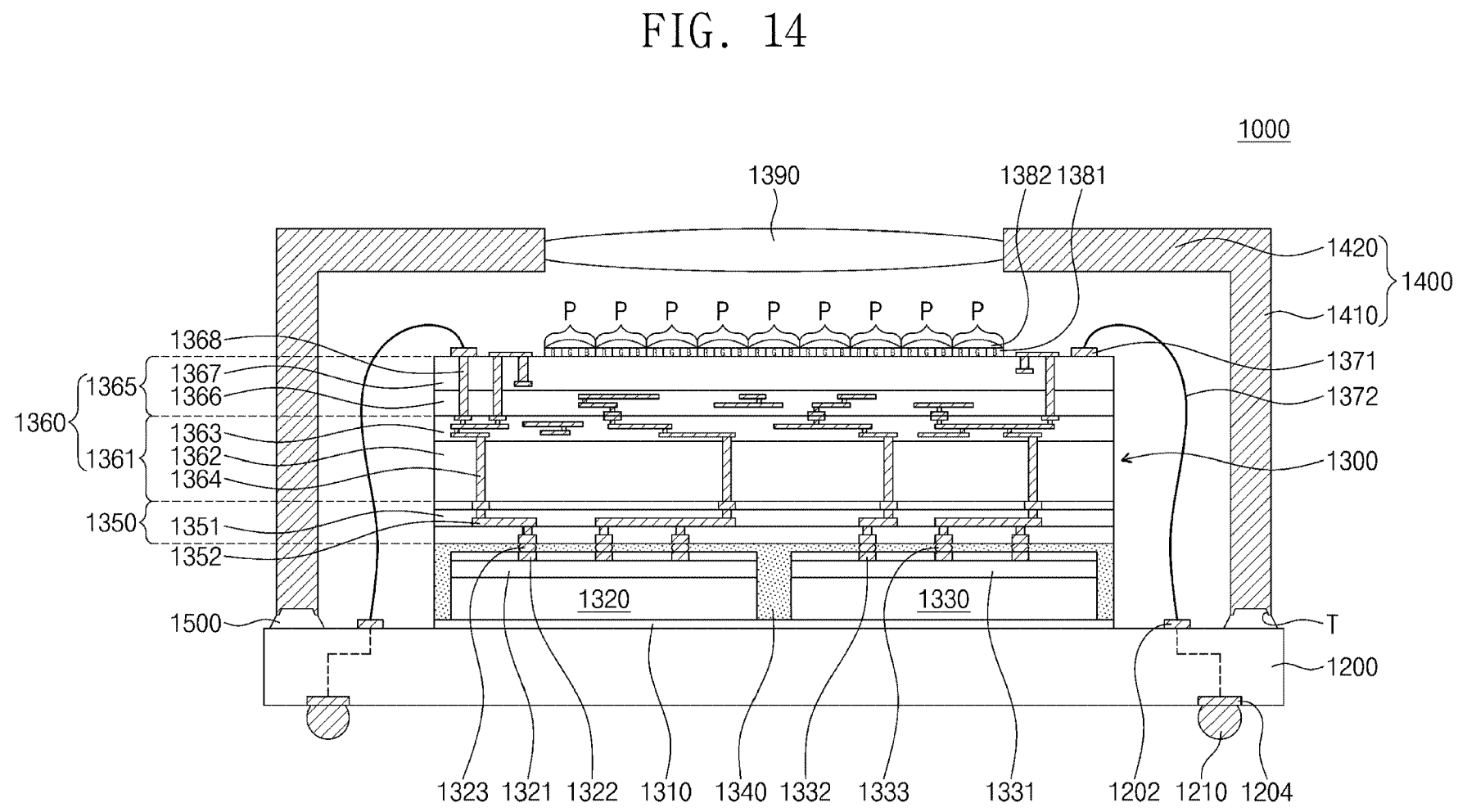

FIG. 14 illustrates a cross-sectional view showing a semiconductor package according to some example embodiments of the present inventive concepts.

Referring to FIG. 14, a semiconductor package 1000 may be an image sensor. The semiconductor package 1000 discussed with reference to FIG. 14 is an illustrative example of semiconductor packages according to some embodiments of the present inventive concepts, and a semiconductor package according to the present inventive concepts is not limited to the semiconductor package 1000.

A substrate 1200 may be provided. The substrate 1200 may correspond to the package substrate 200 discussed with reference to FIGS. 1 to 13. For example, the substrate 1200 may include or may be a printed circuit board (PCB). The substrate 1200 may include substrate pads 1202 and 1204 and external terminals 1210. The substrate 1200 may be provided with first substrate pads 1202 on a top surface thereof. The substrate 1200 may be provided with second substrate pads 1204 on a bottom surface thereof. The external terminals 1210 may be provided on the second substrate pads 1204 on the bottom surface of the substrate 1200. The external terminals 1210 may each have a solder-ball shape or a solder-bump shape. For example, the external terminals 1210 may be solder-balls or solder-bumps. As designated by dot lines, the external terminals 1210 may be electrically connected through the substrate 1200 to the first substrate pads 1202.

An image sensor device 1300 may be disposed on the substrate 1200. The image sensor device 1300 may be an example of the semiconductor device 300 discussed with reference to FIGS. 1 to 13. The following describes in detail a configuration of the image sensor device 1300.

A first semiconductor chip 1320 may be provided on the substrate 1200. The first semiconductor chip 1320 may include or may be a memory chip, such as a dynamic random-access memory (DRAM) chip, a static random-access memory (SRAM) chip, a magnetic random-access memory (MRAM) chip, or a flash memory chip. The first semiconductor chip 1320 may include silicon (Si). The first semiconductor chip 1320 may have a top surface or an active surface. For example, the top surface of the first semiconductor chip 1320 may be the active surface of the first semiconductor chip 1320. For example, the first semiconductor chip 1320 may include, on its upper portion, a first circuit layer 1321 and a first chip pad 1322. The first chip pad 1322 may be electrically connected to integrated circuits and/or an integrated circuit element in the first circuit layer 1321. As used herein, an active surface of a semiconductor chip may be a surface of the semiconductor chip on which active elements, circuits and/or electrical pads are formed.

A second semiconductor chip 1330 may be provided on the substrate 1200. The second semiconductor chip 1330 may be spaced apart from the first semiconductor chip 1320. The second semiconductor chip 1330 may be of the same type as the first semiconductor chip 1320. Alternatively, the second semiconductor chip 1330 may be of a different type from the first semiconductor chip 1320 or may be a dummy chip. The second semiconductor chip 1330 may include or may be a memory chip, such as a dynamic random-access memory (DRAM) chip, a static random-access memory (SRAM) chip, a magnetic random-access memory (MRAM) chip, or a flash memory chip. The second semiconductor chip 1330 may include silicon. The second semiconductor chip 1330 may have a top surface or an active surface. For example, the top surface of the second semiconductor chip 1330 may be the active surface of the second semiconductor chip 1330. For example, the second semiconductor chip 1330 may include, on its upper portion, a second circuit layer 1331 and a second chip pad 1332. The second chip pad 1332 may be electrically connected to integrated circuits and/or an integrated circuit element in the second circuit layer 1331. Alternatively, when the second semiconductor chip 1330 is a dummy chip, the second circuit layer 1331 and the second chip pad 1332 may be omitted.

The first and second semiconductor chips 1320 and 1330 may be attached onto the substrate 1200. For example, a substrate adhesive layer 1310 may be interposed between the substrate 1200 and the first and second semiconductor chips 1320 and 1330.

A molding layer 1340 may be provided on the substrate 1200. The molding layer 1340 may cover the first and second semiconductor chips 1320 and 1330. The first and second semiconductor chips 1320 and 1330 may have their lateral surfaces covered with the molding layer 1340. The molding layer 1340 may fill a space between the first semiconductor chip 1320 and the second semiconductor chip 1330. The molding layer 1340 may not cover any of bottom surfaces of the first and second semiconductor chips 1320 and 1330. The molding layer 1340 may expose the first chip pad 1322 of the first semiconductor chip 1320 and the second chip pad 1332 of the second semiconductor chip 1330. The molding layer 1340 may prevent the first and second semiconductor chips 1320 and 1330 from being damaged due to external impact and/or moisture. The molding layer 1340 may include or be formed of a dielectric polymer, such as an epoxy molding compound (EMC).

An image sensor part 1360 may be disposed on the molding layer 1340. In a plan view, the image sensor part 1360 may overlap the first semiconductor chip 1320 and the second semiconductor chip 1330. For example, the image sensor part 1360 may vertically overlap the first semiconductor chip 1320 and the second semiconductor chip 1330. The image sensor part 1360 may have a top surface that is a front surface on which light is incident. The image sensor part 1360 may have a bottom surface directed toward (e.g., facing) the first and second semiconductor chips 1320 and 1330. The image sensor part 1360 may have a lateral surface coplanar with that of the molding layer 1340. The image sensor part 1360 may be supported by the molding layer 1340. Therefore, the image sensor part 1360 may be stably disposed on the molding layer 1340 and the first and second semiconductor chips 1320 and 1330. The image sensor part 1360 may detect light incident on the top surface thereof, and may then output an electrical signal from the detected light.

The image sensor part 1360 may include a third semiconductor chip 1361 and a sensing chip 1365. The sensing chip 1365 may include a photodiode that detects light. The third semiconductor chip 1361 may include or may be a logic chip in which light detected by the sensing chip 1365 is converted into an electrical signal. The sensing chip 1365 may also be referred to as an image sensor chip.

The third semiconductor chip 1361 may be disposed on the molding layer 1340. The third semiconductor chip 1361 may include a first base layer 1362, a third circuit layer 1363, and a first via 1364. The first base layer 1362 may include or may be a silicon substrate. The third circuit layer 1363 may be provided on the first base layer 1362. The third circuit layer 1363 may include integrated circuits (e.g., transistors) and wiring patterns. One of the wiring patterns of the third circuit layer 1363 may be a first bonding pad that is exposed on a top surface of the third semiconductor chip 1361. Therefore, the top surface of the third semiconductor chip 1361 may serve as an active surface. The first via 1364 may penetrate the first base layer 1362 to electrically connect to the third circuit layer 1363 and one of the first and second semiconductor chips 1320 and 1330. Therefore, short electrical connection paths may be provided between the third semiconductor chip 1361 and the first and second semiconductor chips 1320 and 1330.

The sensing chip 1365 may be disposed on the third semiconductor chip 1361. The sensing chip 1365 may include a second base layer 1367, a fourth circuit layer 1366, and a second via 1368. The second base layer 1367 may include or may be a silicon substrate. The fourth circuit layer 1366 may be disposed in a lower portion of the sensing chip 1365 so as to be adjacent to the third semiconductor chip 1361. The fourth circuit layer 1366 may include a photodiode, an integrated circuit (e.g., sensing transistor), and a wiring pattern. One of the wiring patterns of the fourth circuit layer 1366 may be a second bonding pad that is exposed on a bottom surface of the sensing chip 1365. Therefore, the bottom surface of the sensing chip 1365 may serve as an active surface. The second bonding pad may be in contact with the first bonding pad. Thus, the sensing chip 1365 may be electrically connected to the third semiconductor chip 1361 through the first and second bonding pads. The second via 1368 may penetrate at least a portion of the sensing chip 1365. The second via 1368 may penetrate the sensing chip 1365 to electrically connect to the third semiconductor chip 1361. Alternatively, the second via 1368 may penetrate a portion of the sensing chip 1365 to electrically connect to the sensing chip 1365.

A pixel array may be provided on the image sensor part 1360. The pixel array may include pixels P provided on the sensing chip 1365. The pixels P may be provided on a central region of the image sensor part 1360, e.g., in a plan view. The image sensor part 1360 may be provided on its top surface with color filters 1381 and micro-lenses 1382 that are provided on corresponding pixels P.

The image sensor part 1360 may be provided with connection pads 1371 on the top surface thereof. The connection pads 1371 may be disposed on an outer portion at the top surface of the image sensor part 1360. The connection pads 1371 may be spaced apart from the pixel array. The connection pads 1371 may be electrically connected to the second via 1368 of the sensing chip 1365. The connection pads 1371 may be electrically connected/coupled through bonding wires 1372 to the first substrate pads 1202. The image sensor part 1360 may be electrically connected through the bonding wires 1372 to the substrate 1200.

A redistribution layer 1350 may be provided between the image sensor part 1360 and the first and second semiconductor chips 1320 and 1330. The redistribution layer 1350 may extend between the molding layer 1340 and the image sensor part 1360. The redistribution layer 1350 may include dielectric layers 1351 and a redistribution pattern 1352. The redistribution pattern 1352 may include a conductive layer (e.g., a conductive pattern layer) and conductive vias. The redistribution layer 1350 may be electrically connected to the third semiconductor chip 1361. The first semiconductor chip 1320 may be electrically connected through a first connection terminal 1323 to the redistribution layer 1350. For example, the first connection terminal 1323 may be provided between the redistribution layer 1350 and the first semiconductor chip 1320. The second semiconductor chip 1330 may be electrically connected through a second connection terminal 1333 to the redistribution layer 1350. For example, the second connection terminal 1333 may be provided between the redistribution layer 1350 and the second semiconductor chip 1330. The redistribution layer 1350 may allow the first and second semiconductor chips 1320 and 1330 to have an increase in the degree of freedom of placement.

A holder 1400 may be provided on the substrate 1200, thereby supporting a lens 1390. The lens 1390 may be disposed on the holder 1400. The lens 1390 may be spaced apart from and may face the image sensor part 1360. The lens 1390 may allow light to pass therethrough. The holder 1400 may correspond to the package cap 400 discussed with reference to FIGS. 1 to 13. For example, the holder 1400 may cover the image sensor device 1300 on the substrate 1200. The holder 1400 may include a partition portion 1410 placed on a side of the image sensor device 1300 and an extension portion 1420 on/above the image sensor device 1300.

The partition portion 1410 of the holder 1400 may be disposed on the substrate 1200 on a side of the image sensor device 1300. The partition portion 1410 may have a partition wall shape that surrounds the image sensor device 1300.

The extension portion 1420 of the holder 1400 may be disposed above the image sensor device 1300. For example, the extension portion 1420 may be disposed on the partition portion 1410. The extension portion 1420 may be connected to a top end of the partition portion 1410 to be spaced apart from the substrate 1200. The extension portion 1420 may extend onto/over the image sensor device 1300 from the top end of the partition portion 1410. The extension portion 1420 may cover an entirety of the image sensor device 1300. The lens 1390 may be fixed to the extension portion 1420.

The holder 1400 may be attached through an adhesive layer 1500 to the substrate 1200. For example, the adhesive layer 1500 may be provided on a bottom surface of the partition portion 1410 of the holder 1400. The adhesive layer 1500 may attach the bottom surface of the partition portion 1410 to the top surface of the substrate 1200.

A portion of the adhesive layer 1500 may be inserted/introduced into the partition portion 1410 of the holder 1400. For example, the partition portion 1410 of the holder 1400 may have a trench T formed on the bottom surface of the partition portion 1410, and the adhesive layer 1500 may fill the trench T on the bottom surface of the partition portion 1410. A shape and placement of the trench T and a configuration of a protrusion provided in the trench T may be identical or similar to those discussed with reference to FIGS. 4 to 13.

Figure 15:
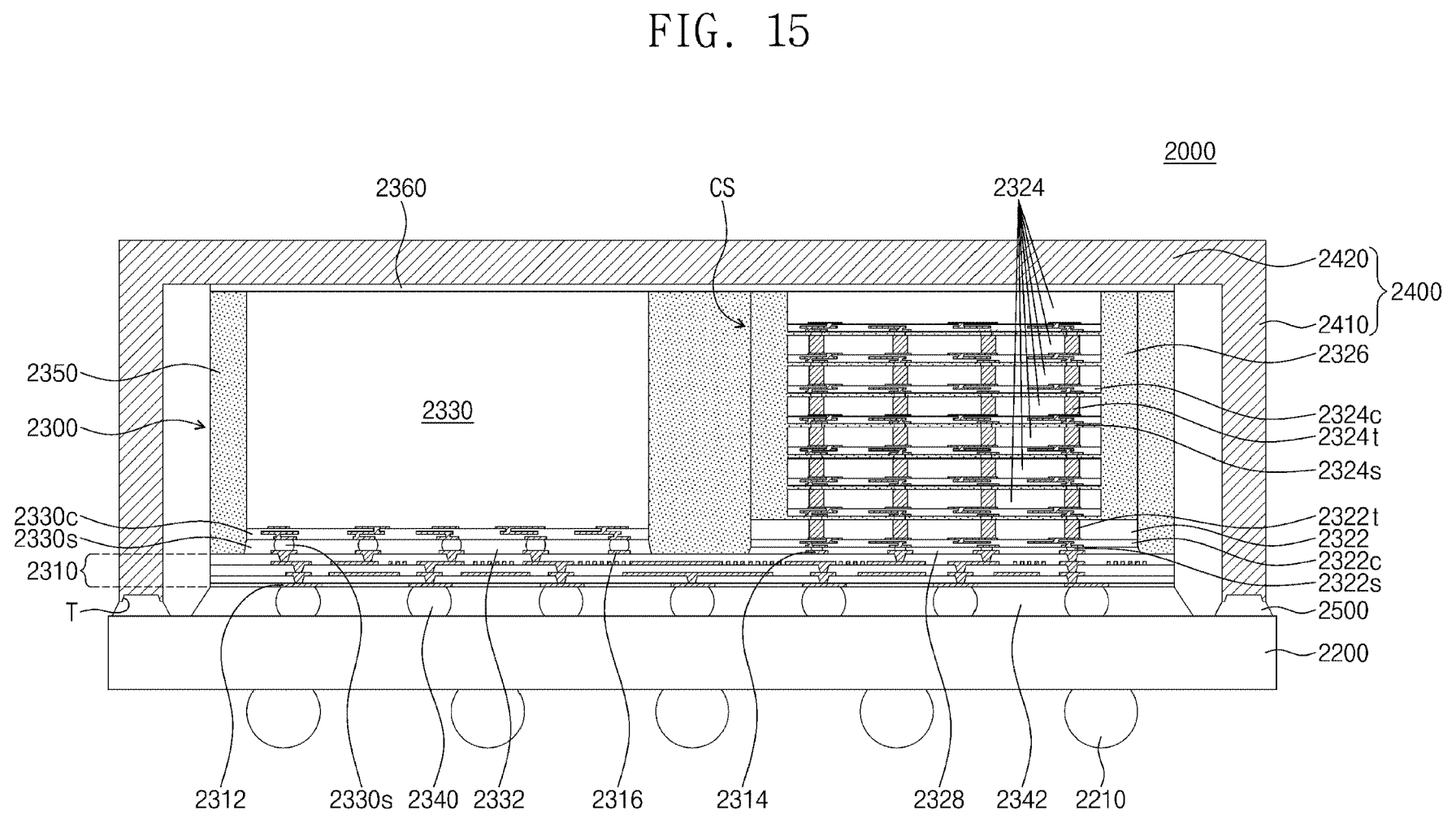

FIG. 15 illustrates a cross-sectional view showing a semiconductor package according to some example embodiments of the present inventive concepts.

Referring to FIG. 15, a semiconductor package 2000 may be a stacked package. The semiconductor package 2000 discussed with reference to FIG. 15 is an illustrative example of semiconductor packages according to some embodiments of the present inventive concepts, and a semiconductor package according to the present inventive concepts is not limited to the semiconductor package 2000.

A package substrate 2200 may be provided. The package substrate 2200 may include or may be a printed circuit board (PCB) having a signal pattern on a top surface of the printed circuit board. Alternatively, the package substrate 2200 may have a structure in which one or more dielectric layers are stacked alternately with one or more wiring layers. The package substrate 2200 may have pads disposed on a top surface thereof.

A plurality of external terminals 2210 may be disposed below the package substrate 2200. For example, the external terminals 2210 may be disposed on terminal pads provided on a bottom surface of the package substrate 2200. The external terminals 2210 may include or may be solder balls or solder bumps, and based on types of the external terminals 2210, the semiconductor package 2000 may be provided in the shape of one of a ball grid array (BGA) type, a fine ball-grid array (FBGA) type, and a land grid array (LGA) type.

A stacked semiconductor device 2300 may be disposed on the package substrate 2200. The stacked semiconductor device 2300 may be an example of the semiconductor device 300 discussed with reference to FIGS. 1 to 13. The following will describe in detail a configuration of the stacked semiconductor device 2300.

An interposer substrate 2310 may be provided on the package substrate 2200. The interposer substrate 2310 may include at least two wiring layers. For example, there may be provided wiring layers that are stacked on each other. Each of the wiring layers may include a dielectric pattern and a wiring pattern buried in the dielectric pattern. A lowermost one of the wiring layers may have first substrate pads 2312 electrically connected to the wiring patterns. The first substrate pads 2312 may be exposed on a bottom surface of the interposer substrate 2310. An uppermost one of the wiring layers may have second substrate pads 2314 and third substrate pads 2316 that are electrically connected to the wiring patterns. The second substrate pads 2314 and the third substrate pads 2316 may be exposed on a top surface of the interposer substrate 2310. The second substrate pads 2314 may be pads for mounting a chip stack CS which will be discussed below, and the third substrate pads 2316 may be pads for mounting a second semiconductor chip 2330 which will be discussed below.

The interposer substrate 2310 may be mounted on the top surface of the package substrate 2200. The interposer substrate 2310 may be provided thereon with substrate terminals 2340 on the bottom surface thereof. The substrate terminals 2340 may be provided between the pads of the package substrate 2200 and the first substrate pads 2312 of the interposer substrate 2310. The substrate terminals 2340 may electrically connect the interposer substrate 2310 to the package substrate 2200. For example, the interposer substrate 2310 may be flip-chip mounted on the package substrate 2200. The substrate terminals 2340 may include or may be solder balls or solder bumps.

A first under-fill layer 2342 may be provided between the package substrate 2200 and the interposer substrate 2310. The first under-fill layer 2342 may surround the substrate terminals 2340, while filling a space between the package substrate 2200 and the interposer substrate 2310.

A chip stack CS may be disposed on the interposer substrate 2310. The chip stack CS may include a base substrate, first semiconductor chips 2324 stacked on the base substrate, and a first molding layer 2326 that surrounds the first semiconductor chips 2324. The following will describe in detail a configuration of the chip stack CS.

The base substrate may be a base semiconductor chip 2322. For example, the base substrate may be a wafer-level semiconductor substrate formed of a semiconductor material, such as silicon (Si). In this description below, the base semiconductor chip 2322 and the base substrate may indicate the same component and may be allocated with the same reference numeral.

The base semiconductor chip 2322 may include a base circuit layer 2322*c* and base through electrode 2322*t*. The base circuit layer 2322*c* may be provided on a bottom surface of the base semiconductor chip 2322. The base circuit layer 2322*c* may include an integrated circuit. For example, the base circuit layer 2322*c* may include or be formed of a memory circuit. For example, the base semiconductor chip 2322 may be a memory chip, such as a dynamic random-access memory (DRAM) chip, a static random-access memory (SRAM) chip, a magnetic random-access memory (MRAM) chip, or a flash memory chip. The base through electrodes 2322*t* may penetrate the base semiconductor chip 2322 in a direction perpendicular to the top surface of the interposer substrate 2310. The base through electrodes 2322*t* may be electrically connected to the base circuit layer 2322*c*. The bottom surface of the base semiconductor chip 2322 may be an active surface. FIG. 15 depicts that the base substrate includes/is the base semiconductor chip 2322, but the present inventive concepts are not limited thereto. According to some embodiments of the present inventive concepts, the base substrate may not include the base semiconductor chip 2322. For example, the base substrate may be a substrate other than the base semiconductor chip 2322 in certain embodiments.

The base semiconductor chip 2322 may further include a protection layer and first connection terminals 2322*s*. The protection layer may be disposed on the bottom surface of the base semiconductor chip 2322, thereby covering the base circuit layer 2322*c*. The protection layer may include or be formed of silicon nitride (SiN). The first connection terminals 2322*s* may be provided on the bottom surface of the base semiconductor chip 2322. The first connection terminals 2322*s* may be electrically connected to an integrated circuit of the base circuit layer 2322*c*. The protection layer may expose the first connection terminals 2322*s*.

The first semiconductor chip 2324 may be mounted on the base semiconductor chip 2322. For example, the first semiconductor chip 2324 and the base semiconductor chip 2322 may constitute/have a chip-on-wafer (COW) structure. The first semiconductor chip 2324 may have a width less than that of the base semiconductor chip 2322.

The first semiconductor chip 2324 may include a first circuit layer 2324*c* and first through electrodes 2324*t*. The first circuit layer 2324*c* may include a memory circuit. For example, the first semiconductor chip 2324 may be a memory chip, such as a dynamic random-access memory (DRAM) chip, a static random-access memory (SRAM) chip, a magnetic random-access memory (MRAM) chip, or a flash memory chip. The first circuit layer 2324*c* may include the same circuit as that of the base circuit layer 2322*c*, but the present inventive concepts are not limited thereto. The first through electrodes 2324*t* may penetrate the first semiconductor chip 2324 in a direction perpendicular to the top surface of the interposer substrate 2310. The first through electrode 2324*t* and the first circuit layer 2324*c* may be electrically connected to each other. The first semiconductor chip 2324 may have a bottom surface or an active surface. For example, the bottom surface of the first semiconductor chip 2324 may be the active surface of the first semiconductor chip 2324. A plurality of first chip bumps 2324*s* may be provided on the bottom surface of the first semiconductor chip 2324. The first chip bumps 2324*s* may lie between the base semiconductor chip 2322 and the first semiconductor chip 2324, and electrically connect the base semiconductor chip 2322 and the first semiconductor chip 2324 to each other.

The chip stack CS may include a plurality of first semiconductor chips 2324. For example, the plurality of first semiconductor chips 2324 may be stacked on the base semiconductor chip 2322. The number of stacked first semiconductor chips 2324 may be about 8 to about 32. The first chip bumps 2324*s* may be correspondingly provided between the first semiconductor chips 2324. In this configuration, an uppermost first semiconductor chip 2324 may not include the first through electrode 2324*t*. In addition, the uppermost first semiconductor chip 2324 may have a thickness greater than those of other first semiconductor chips 2324 that underlie the uppermost first semiconductor chip 2324.

Although not shown, an adhesive layer may be provided between the first semiconductor chips 2324. The adhesive layer may include a non-conductive film (NCF). The adhesive layer may be interposed between the first chip bumps 2324*s* between the first semiconductor chips 2324, and may prevent the occurrence of electric short between the first chip bumps 2324*s*.

A first molding layer 2326 may be disposed on a top surface of the base semiconductor chip 2322. The first molding layer 2326 may cover the base semiconductor chip 2322 and may surround the first semiconductor chips 2324. The first molding layer 2326 may have a top surface coplanar with that of the uppermost first semiconductor chip 2324, and the uppermost first semiconductor chip 2324 may be exposed from the first molding layer 2326. The first molding layer 2326 may include or be formed of a dielectric polymer material. For example, the first molding layer 2326 may include or be formed of an epoxy molding compound (EMC).

The chip stack CS may thus be provided. The chip stack CS may be mounted on the interposer substrate 2310. For example, the chip stack CS may be electrically connected/coupled through the first connection terminals 2322*s* of the base semiconductor chip 2322 to the second substrate pads 2314 of the interposer substrate 2310. The first connection terminals 2322*s* may be provided between the base circuit layer 2322*c* and the second substrate pads 2314 of the interposer substrate 2310.

A second under-fill layer 2328 may be provided between the interposer substrate 2310 and the chip stack CS. The second under-fill layer 2328 may surround the first connection terminals 2322*s*, while filling a space between the interposer substrate 2310 and the base semiconductor chip 2322.

A second semiconductor chip 2330 may be disposed on the interposer substrate 2310. The second semiconductor chip 2330 may be spaced apart from the chip stack CS. The second semiconductor chip 2330 may have a thickness greater than those of the first semiconductor chips 2324. The second semiconductor chip 2330 may include a semiconductor material, such as silicon (Si). The second semiconductor chip 2330 may include a second circuit layer 2330*c*. The second circuit layer 2330*c* may include a logic circuit. For example, the second semiconductor chip 2330 may be a logic chip. A bottom surface of the second semiconductor chip 2330 may be an active surface, and a top surface of the second semiconductor chip 2330 may be an inactive surface. For example, the inactive surface of the second semiconductor chip 2330 may be a surface on which no active elements or circuits which affect an electrical functionality of the second semiconductor chip 2330 are formed. A plurality of second connection terminals 2330*s* may be provided on the bottom surface of the second semiconductor chip 2330. The second connection terminals 2330*s* may be electrically connected to an integrated circuit of the second circuit layer 2330*c*.

The second semiconductor chip 2330 may be mounted on the interposer substrate 2310. For example, the second semiconductor chip 2330 may be coupled through the second connection terminals 2330*s* to the third substrate pads 2316 of the interposer substrate 2310. The second connection terminals 2330*s* may be provided between the second circuit layer 2330*c* and the third substrate pads 2316 of the interposer substrate 2310.

A third under-fill layer 2332 may be provided between the interposer substrate 2310 and the second semiconductor chip 2330. The third under-fill layer 2332 may surround the second connection terminals 2330*s*, while filling a space between the interposer substrate 2310 and the second semiconductor chip 2330.

A second molding layer 2350 may be provided on the interposer substrate 2310. The second molding layer 2350 may cover the top surface of the interposer substrate 2310. The second molding layer 2350 may surround the chip stack CS and the second semiconductor chip 2330. For example, the second molding layer 2350 may be formed and filled between the chip stack CS and the second semiconductor chip 2330. The second molding layer 2350 may include or be formed of a dielectric material. For example, the second molding layer 2350 may include or be formed of an epoxy molding compound (EMC).

A package cap 2400 may be provided on the package substrate 2200. The package cap 2400 may correspond to the package cap 400 discussed with reference to FIGS. 1 to 13. For example, on the package substrate 2200, the package cap 2400 may cover the chip stack CS and the second semiconductor chip 2330. The package cap 2400 may have a partition portion 2410 placed on a side of the interposer substrate 2310, and may also have an extension portion 2420 on/above the chip stack CS and the second semiconductor chip 2330.

The partition portion 2410 of the package cap 2400 may be disposed on the package substrate 2200 on a side of the interposer substrate 2310. The partition portion 2410 may have a partition wall shape that surrounds the interposer substrate 2310.

The extension portion 2420 of the package cap 2400 may be disposed above the chip stack CS and the second semiconductor chip 2330. For example, the extension portion 2420 may be disposed on the partition portion 2410. The extension portion 2420 may be connected to a top end of the partition portion 2410 to be spaced apart from the package substrate 2200. The extension portion 2420 may extend from the top end of the partition portion 2410 onto the chip stack CS and the second semiconductor chip 2330. The extension portion 2420 may entirely cover the chip stack CS and the second semiconductor chip 2330. For example, the extension portion 2420 may vertically overlap the entirety of the chip stack CS and the second semiconductor chip 2330. For example, the package cap 2400 including the extension portion 2420 and the partition portion 2410 may be integrally formed as one body.

A thermal interface material (TIM) layer 2360 may be interposed between the package cap 2400 and all of the chip stack CS, the second semiconductor chip 2330, and the second molding layer 2350. For example, the thermal interface material layer 2360 may be provided between the package cap 2400 and the chip stack CS, between the package cap 2400 and the second semiconductor chip 2330, and between the package cap 2400 and the second molding layer 2350. The thermal interface material layer 2360 may be a thermal transfer member for transmitting heat to the package cap 2400 from the chip stack CS and the second semiconductor chip 2330. The thermal interface material layer 2360 may include or be formed of thermal grease, epoxy materials, or solid particles of metal such as indium (P).

The package cap 2400 may be attached through an adhesive layer 2500 to the package substrate 2200. For example, the adhesive layer 2500 may be provided on a bottom surface of the partition portion 2410 of the package cap 2400. The adhesive layer 2500 may attach the bottom surface of the partition portion 2410 to the top surface of the package substrate 2200.

A portion of the adhesive layer 2500 may be inserted into the partition portion 2410 of the package cap 2400. For example, the partition portion 2410 of the package cap 2400 may have a trench T formed on the bottom surface of the partition portion 2410, and the adhesive layer 2500 may fill the trench T formed on the bottom surface of the partition portion 2410. A shape and placement of the trench T and a configuration of a protrusion provided in the trench T may be identical or similar to those discussed with reference to FIGS. 4 to 13.

A semiconductor package according to some embodiments of the present inventive concepts may include a trench formed on a bottom surface of a package cap, and thus a large contact area and a high adhesive force may be provided between an adhesive layer and the package cap. Therefore, the package cap may be rigidly/strongly attached to a package substrate, and the semiconductor package may be provided with increased structural stability.

As the trench has a trapezoidal shape and/or inclined side walls, when a process is performed to attach the adhesive layer to the bottom surface of the package cap, the adhesive layer may be easily inserted/introduced into the trench, and no air gap may be produced inside the trench. For example, the inclined side walls of the trench may be beneficial to reduce air gap/bubbles inside the trench and/or inside the adhesive layer. Accordingly, the adhesive layer may be prevented from being delaminated due to the air gap from the package cap. As a result, it may be beneficial to provide a semiconductor package fabrication method reducing failure and to provide the semiconductor package with increased structural stability.

Moreover, in a process where the adhesive layer is attached to the bottom surface of the package cap when the semiconductor package is fabricated, the adhesive layer may be introduced into the trench, and remaining portions of the adhesive layer may be prevented from excessively protruding from an inner lateral surface and/or an outer lateral surface of the package cap. For example, an increased margin of a proper amount of the adhesive material applied between the package cap and the package substrate due to the increased space (the trench) in which the adhesive material is applied is beneficial to reduce excessive/overflowing adhesive material which may protrude from the lateral surface of the package cap. Hence, the package substrate may be prevented from being contaminated due to the remaining/overflowing portions of the adhesive layer, and the semiconductor package may be prevented from warpage caused by the remaining/overflowing portions of the adhesive layer.

Although the present inventive concepts have been described in connection with some embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising:

a package substrate having a mount region and a peripheral region that surrounds the mount region;

a semiconductor device on the mount region of the package substrate;

a package cap on the peripheral region of the package substrate, the package cap including a partition portion that surrounds the semiconductor device and an extension portion that covers the semiconductor device; and an adhesive layer between the package substrate and a bottom surface of the package cap, wherein the bottom surface of the package cap has a plurality of trenches, wherein, for each trench of the plurality of trenches:

the trench has a trapezoidal cross-section whose width decreases in a direction receding from the bottom surface of the package cap, the trench has a first surface that is farthest away from the bottom surface of the package cap, a width of the first surface of the trench is smaller than a width of the trench at the bottom surface of the package cap, and the adhesive layer fills the trench, wherein the adhesive layer is in contact with a top surface of the package substrate and the bottom surface of the package cap, and wherein a depth of a first trench of the plurality of trenches is greater than a depth of a second trench of the plurality of trenches.

2. The semiconductor package of claim 1, wherein each trench of the plurality of trenches has a ring shape that extends along between an inner lateral surface and an outer lateral surface of the partition portion of the package cap, the inner lateral surface of the partition portion facing the semiconductor device, and the outer lateral surface of the partition portion being opposite the inner lateral surface of the partition portion.

3. The semiconductor package of claim 1, wherein the plurality of trenches are between an inner lateral surface and an outer lateral surface of the partition portion of the package cap, the inner lateral surface of the partition portion facing the semiconductor device, and the outer lateral surface of the partition portion being opposite the inner lateral surface of the partition portion.

4. The semiconductor package of claim 3, wherein a depth of each trench of the plurality of trenches increases in a direction approaching the inner lateral surface and the outer lateral surface from a center between the inner and outer lateral surfaces.

5. The semiconductor package of claim 3, wherein the bottom surface of the package cap has outer regions adjacent to the inner lateral surface and the outer lateral surface and an inner region between the outer regions, and wherein depths of first trenches in the outer regions are greater than depths of second trenches in the inner region.

6. A semiconductor package, comprising:

a package substrate having a mount region and a peripheral region that surrounds the mount region;

a semiconductor device on the mount region of the package substrate;

a package cap on the peripheral region of the package substrate, the package cap including a partition portion that surrounds the semiconductor device and an extension portion that covers the semiconductor device; and an adhesive layer between the package substrate and a bottom surface of the package cap, wherein the bottom surface of the package cap has a trench, wherein the trench has a trapezoidal cross-section whose width decreases in a direction receding from the bottom surface of the package cap, wherein the trench has a first surface that is farthest away from the bottom surface of the package cap, wherein a width of the first surface of the trench is smaller than a width of the trench at the bottom surface of the package cap, wherein the adhesive layer is in contact with a top surface of the package substrate and the bottom surface of the package cap, wherein the adhesive layer fills the trench, wherein the package cap has at least a first protrusion protruding toward the package substrate from a bottom surface of the trench, and wherein a width of the first protrusion decreases in a direction receding from the bottom surface of the trench.

7. The semiconductor package of claim 6, wherein a protruding height of the first protrusion is less than a depth of the trench.

8. The semiconductor package of claim 6, wherein a cross-section of the first protrusion has one of a trapezoidal shape, a semicircular shape, and a triangular shape each having a width that decreases in a direction receding from the bottom surface of the trench.

9. A semiconductor package, comprising:

a package substrate;

a semiconductor device on the package substrate; and a package cap disposed on the package substrate and surrounding the semiconductor device, wherein the package cap is attached to the package substrate through an adhesive layer which is on a bottom surface of the package cap, wherein a trench is formed on the bottom surface of the package cap, the trench having a trapezoidal cross-section whose width decreases in a direction receding from the bottom surface of the package cap, wherein a plurality of protrusions are on a bottom surface of the trench and protrude toward the package substrate from the bottom surface of the trench, wherein the trench is disposed between an inner lateral surface and an outer lateral surface of the package cap, the inner lateral surface facing the semiconductor device, and the outer lateral surface being opposite the inner lateral surface, and wherein a protruding height of each of the plurality of protrusions is less than a depth of the trench.

10. The semiconductor package of claim 9, wherein a cross-section of each of the plurality of protrusions has one of a trapezoidal shape, a semicircular shape, and a triangular shape each having a width that decreases in a direction receding from the bottom surface of the trench.

11. The semiconductor package of claim 9, wherein the trench has a ring shape that extends along between an inner lateral surface and an outer lateral surface of the package cap, the inner lateral surface facing the semiconductor device, and the outer lateral surface being opposite the inner lateral surface.

12. The semiconductor package of claim 9, wherein the protruding height of each of the plurality of protrusions increases in a direction receding from an inner lateral surface and an outer lateral surface of the package cap.

13. The semiconductor package of claim 9, wherein the package cap includes:

a partition portion that surrounds the semiconductor device; and an extension portion connected to the partition portion and covering the semiconductor device.

* * * * *